(12) United States Patent
Kawano

(10) Patent No.: US 9,972,691 B2
(45) Date of Patent: May 15, 2018

(54) SEMICONDUCTOR DEVICE WITH MULTI-FINGER STRUCTURE

(71) Applicant: FUJITSU LIMITED, Kawasaki-shi, Kanagawa (JP)

(72) Inventor: Yoichi Kawano, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/384,705

(22) Filed: Dec. 20, 2016

(65) Prior Publication Data

US 2017/0222001 A1   Aug. 3, 2017

(30) Foreign Application Priority Data

Feb. 3, 2016  (JP) .................................. 2016-018997

(51) Int. Cl.
*H01L 21/02* (2006.01)
*H01L 29/417* (2006.01)
*H01L 23/66* (2006.01)

(52) U.S. Cl.
CPC ........ *H01L 29/41758* (2013.01); *H01L 23/66* (2013.01); *H01L 2223/6616* (2013.01)

(58) Field of Classification Search
CPC ............... H01L 29/41758; H01L 23/66; H01L 2223/6616
See application file for complete search history.

(56) References Cited

U.S. PATENT DOCUMENTS

| | | | |
|---|---|---|---|
| 5,170,235 A * | 12/1992 | Tanino | H01L 23/481 257/276 |
| 5,355,008 A | 10/1994 | Moyer et al. | |
| 2002/0140024 A1* | 10/2002 | Aoki | H01L 29/0692 257/327 |
| 2009/0001471 A1 | 1/2009 | Ohmi et al. | |
| 2009/0050949 A1* | 2/2009 | Maruyama | G11C 11/22 257/295 |
| 2014/0001563 A1* | 1/2014 | Rashed | H01L 27/0207 257/369 |
| 2015/0213180 A1* | 7/2015 | Herberholz | H01L 23/00 716/119 |
| 2017/0077276 A1* | 3/2017 | Suzuki | H01L 29/778 |
| 2017/0229457 A1* | 8/2017 | Maeno | H01L 27/092 |

FOREIGN PATENT DOCUMENTS

| | | |
|---|---|---|
| JP | 09-505689 | 6/1997 |
| JP | 2007-158139 | 6/2007 |
| WO | 2007/072844 | 6/2007 |

* cited by examiner

*Primary Examiner* — Ismail Muse
(74) *Attorney, Agent, or Firm* — Fujitsu Patent Center

(57) ABSTRACT

A semiconductor device includes: diffusion layers that are formed over a semiconductor substrate in a first direction, that are separated from one another by separation regions, and that serve as drain regions or source regions of respective transistors; a gate electrode of the transistors, which is formed in the first direction so as to straddle the diffusion layers; gate extraction wirings that are formed above the separation regions so as to sandwich therebetween the individual diffusion layers in the first direction, that are electrically coupled to the gate electrode above the separation regions, and that supply a gate signal to the gate electrode.

2 Claims, 10 Drawing Sheets

SEMICONDUCTOR DEVICE WITH MULTI-FINGER STRUCTURE

CROSS-REFERENCE TO RELATED APPLICATION

This application is based upon and claims the benefit of priority of the prior Japanese Patent Application No. 2016-018997, filed on Feb. 3, 2016, the entire contents of which are incorporated herein by reference.

FIELD

The embodiments discussed herein are related to semiconductor devices.

BACKGROUND

In recent years, devices to operate in a high frequency range such as a millimeter wave band, a submillimeter wave band, and a THz band have been proposed. An automotive radar that utilizes the millimeter wave band, an equipment for a fifth generation mobile communication system, an imaging device that utilizes the THz band, and so forth are proposed, for example.

On the other hand, as a semiconductor device manufactured by a complementary metal-oxide semiconductor (CMOS) process of the related art, there is a semiconductor device in which transistors are arranged in a gate length direction and in which gate electrodes are arranged by using a multi-finger structure. Note that, in a gate, a drain, or a source of a transistor manufactured by the CMOS process, parasitic resistance or parasitic capacitance is produced. Gate resistance, drain capacitance, and drain resistance, which are included in the parasitic resistance or the parasitic capacitance, are reduced, thereby increasing a maximum operating frequency of the transistor. The gate resistance and the drain capacitance depend on a wiring electrode pattern connected to the transistor.

However, in a semiconductor device of the related art, which has the multi-finger structure, there is a problem that, in the stand points of reliability and a layout, it is difficult to fully reduce the gate resistance or the drain capacitance and it is difficult to increase the maximum operating frequency of the transistor.

The followings are reference documents.
[Document 1] International Publication Pamphlet No. WO 2007/072844,
[Document 2] Japanese Laid-open Patent Publication No. 2007-158139, and
[Document 3] Japanese National Publication of International Patent Application No. 09-505689.

SUMMARY

According to an aspect of the invention, a semiconductor device includes: diffusion layers that are formed over a semiconductor substrate in a first direction, that are separated from one another by separation regions, and that serve as drain regions or source regions of respective transistors; a gate electrode of the transistors, which is formed in the first direction so as to straddle the diffusion layers; gate extraction wirings that are formed above the separation regions so as to sandwich therebetween the individual diffusion layers in the first direction, that are electrically coupled to the gate electrode above the separation regions, and that supply a gate signal to the gate electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments for implementing the disclosed technology will be described with reference to drawings.

First Embodiment

Figure 1:
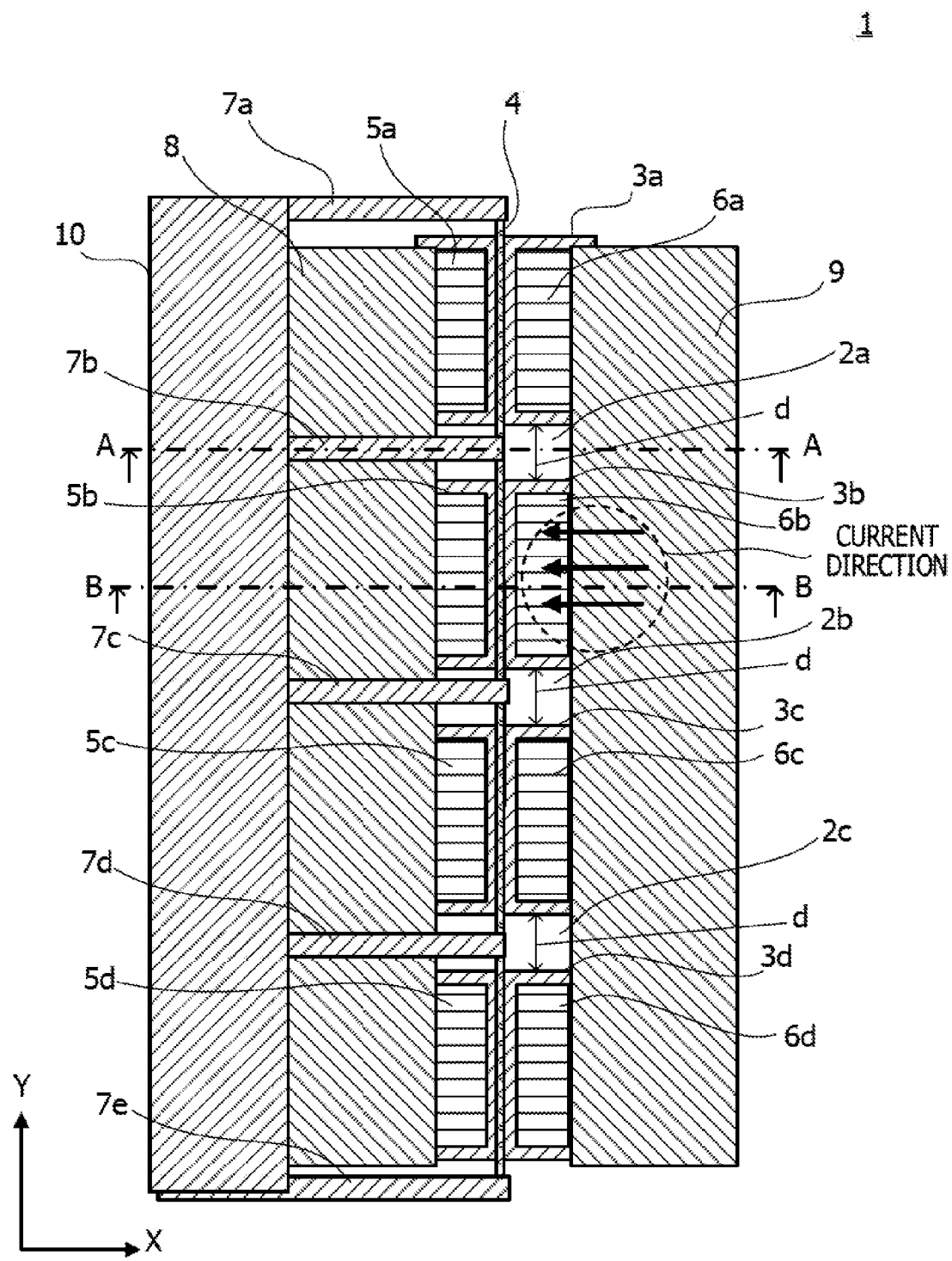
FIG. 1 is a plan view illustrating an example of a semiconductor device of a first embodiment.
Figure 2:
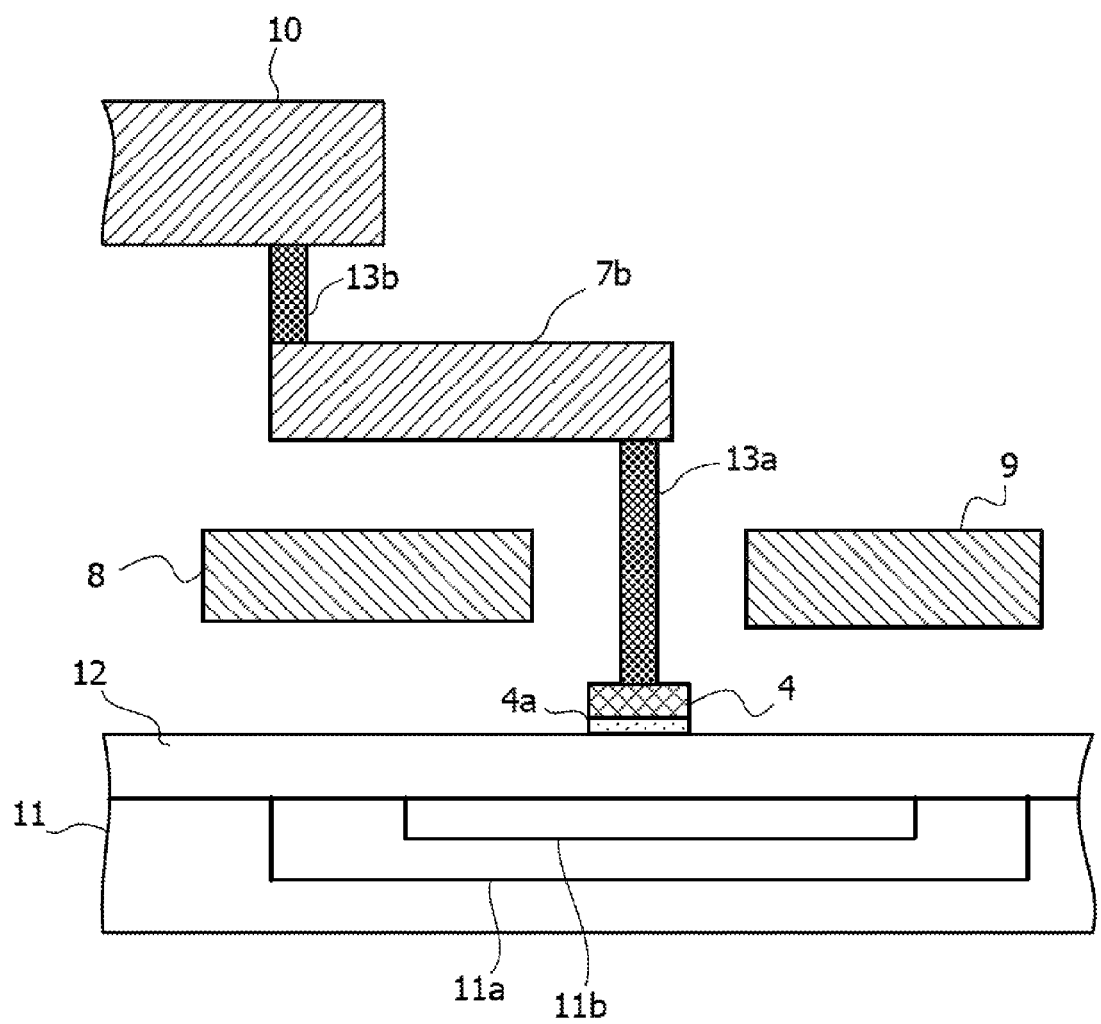
FIG. 2 is a cross-sectional view taken along a line II-II in FIG. 1.
Figure 3:
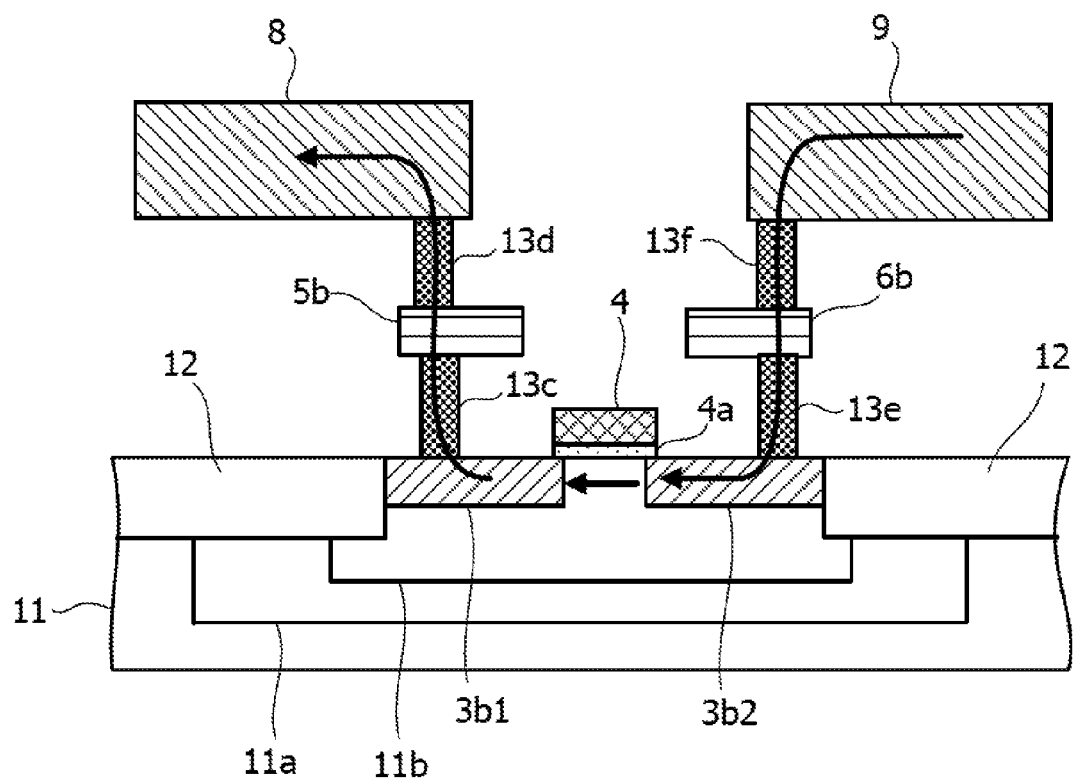
FIG. 3 is a cross-sectional view taken along a line III-III in FIG. 1.

FIG. 1 is a plan view illustrating an example of a semiconductor device of a first embodiment. In addition, FIG. 2 is a cross-sectional view taken along a line II-II in FIG. 1. In addition, FIG. 3 is a cross-sectional view taken along a line III-III in FIG. 1. Note that in each of FIG. 1 to FIG. 3, insulation layers between individual wirings of multilayer wirings and so forth are omitted.

Note that, in what follows, a semiconductor device 1 including n-channel type metal-oxide semiconductor field effect transistors (MOSFETs) will be described as an example. In a case of forming p-channel type MOSFETs in place of the n-channel type MOSFETs, conductivity types of impurities included in diffusion layers only have to be arbitrarily changed.

The semiconductor device 1 is formed in a first direction (hereinafter, called a Y direction) on a semiconductor substrate 11 (see FIG. 2 and FIG. 3) and includes diffusion layers 3a, 3b, 3c, and 3d separated from one another with distances d therebetween by separation regions 2a, 2b, and 2c. Note that while, in the example of FIG. 1, the number of the diffusion layers 3a to 3d is four, the number of the diffusion layers may be two or three, or five or more.

The semiconductor substrate 11 is, for example, a p-type silicon (Si) substrate. The separation regions 2a to 2c are formed by an insulator layer 12 embedded in the semiconductor substrate 11. The insulator layer 12 is, for example, silicon dioxide ($SiO_2$). Note that, as illustrated in FIG. 2 and FIG. 3, a deep N-well 11a and a P-well 11b are formed in the semiconductor substrate 11, for example.

Each of the diffusion layers 3a to 3d is divided into a drain region and a source region ($n^+$ regions) formed by ion-implanting n-type impurities. As illustrated in FIG. 3, the diffusion layer 3b is divided into a source region 3b1 and a drain region 3b2 across a gate electrode 4, for example. Note that a gate oxide film 4a is formed beneath the gate electrode 4.

The semiconductor device 1 further includes the gate electrode 4 formed in the Y direction so as to straddle the diffusion layers 3a to 3d. The gate electrode 4 serves as gate electrodes of transistors formed by using the respective diffusion layers 3a to 3d and is formed by using, for example, polysilicon.

In addition, the semiconductor device 1 includes source electrodes 5a, 5b, 5c, and 5d and drain electrodes 6a, 6b, 6c, and 6d, formed above the diffusion layers 3a to 3d, respectively. While, in the example of FIG. 1, electrodes arranged on a left side across the gate electrode 4 are the source electrodes 5a to 5d and electrodes arranged on a right side across the gate electrode 4 are the drain electrodes 6a to 6d, these may be reversed.

Furthermore, the semiconductor device 1 includes gate extraction wirings 7a, 7b, 7c, 7d, and 7e that are formed above the separation regions 2a to 2c so as to sandwich therebetween the diffusion layers 3a to 3d in the Y direction and that are electrically connected to the gate electrode 4 above the separation regions 2a to 2c.

The gate extraction wirings 7a to 7e supply a gate signal to the gate electrode 4. The gate extraction wirings 7a to 7e are formed by, for example, copper. In addition, the gate electrode 4 and the gate extraction wirings 7a to 7e are connected to each other via vias. The vias are conductive bodies and are formed by using, for example, tungsten.

FIG. 2 illustrates a state in which the gate extraction wiring 7b is connected to the gate electrode 4 via a via 13a.

Note that the gate extraction wirings 7a to 7e may be connected to the gate electrode 4 via wiring layers and vias.

In addition, the semiconductor device 1 includes a source wiring 8, a drain wiring 9, and a gate wiring 10. The source wiring 8, the drain wiring 9, and the gate wiring 10 are formed by, for example, copper.

The source wiring 8 and the drain wiring 9 are apposed with a predetermined distance therebetween in an X direction. The source wiring 8 is electrically connected to the source electrodes 5a to 5d. The drain wiring 9 is electrically connected to the drain electrodes 6a to 6d.

Note that the source wiring 8 and the source electrodes 5a to 5d are connected to each other via vias. The drain wiring 9 and the drain electrodes 6a to 6d are connected to each other via vias.

In FIG. 3, a state in which the source electrode 5b connected to the source region 3b1 via a via 13c is further connected to the source wiring 8 via a via 13d is illustrated. In addition, a state in which the drain electrode 6b connected to the drain region 3b2 via a via 13e is further connected to the drain wiring 9 via a via 13f is illustrated.

Note that, in FIG. 3, directions in which an electric current flows in a case of applying a gate voltage (a value greater than or equal to a threshold value) and a drain voltage are indicated by arrows. An arrow under the gate electrode 4 (the gate oxide film 4a) indicates a direction of the electric current that flows in a channel.

Note that the source wiring 8 may be connected to the source electrodes 5a to 5d via wiring layers and vias. The same applies to the drain wiring 9.

The gate wiring 10 is electrically connected to the gate extraction wirings 7a to 7e. Note that the gate wiring 10 and the gate extraction wirings 7a to 7e are connected to each other via vias. FIG. 2 illustrates a state in which the gate wiring 10 and the gate extraction wiring 7b are connected to each other via a via 13b.

By the way, transistors formed in the respective diffusion layers 3a to 3d in such a semiconductor device 1 as described above are each represented by the following equivalent circuit.

Figure 4:
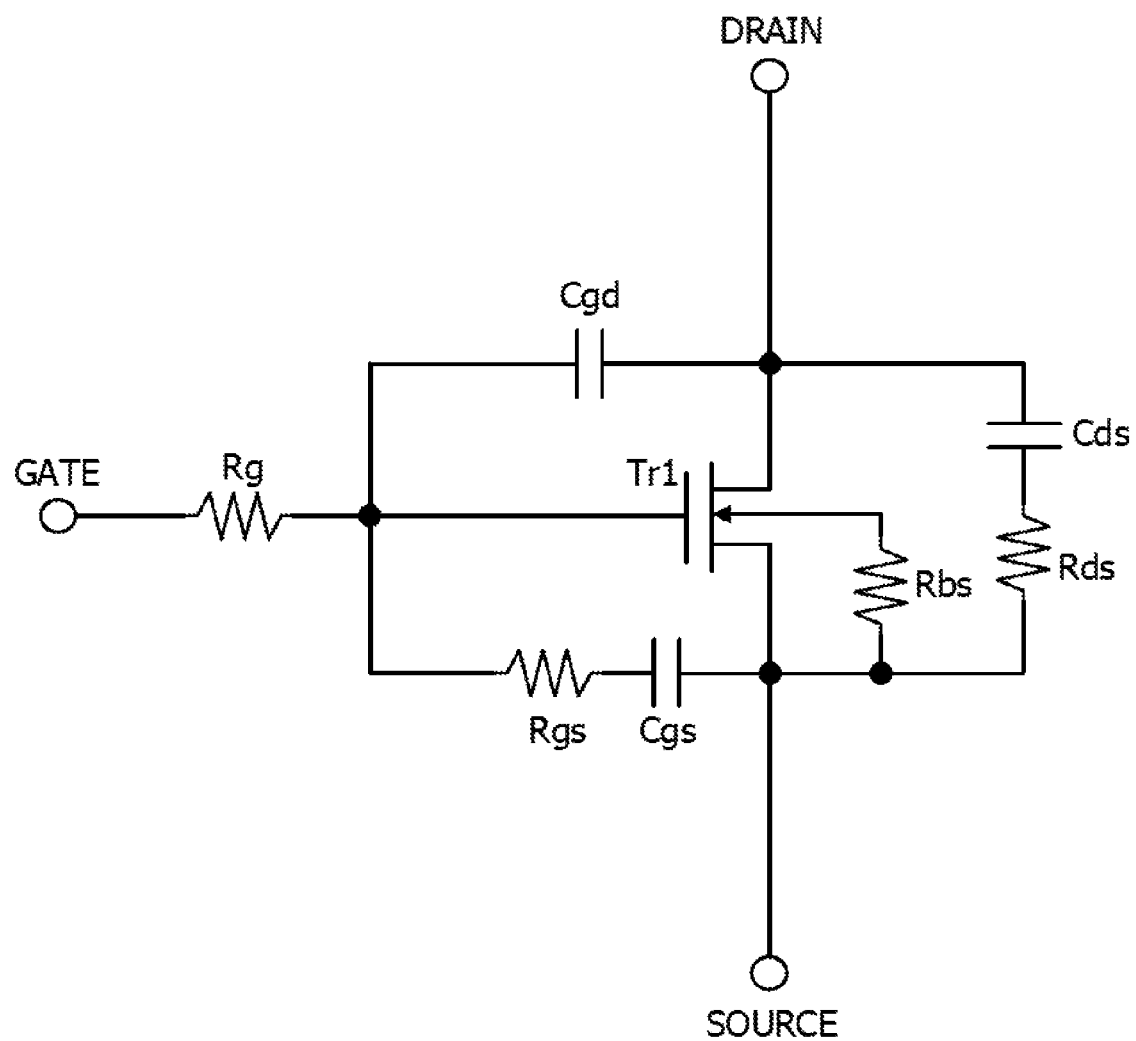
FIG. 4 is a diagram illustrating an example of an equivalent circuit of a transistor.

FIG. 4 is a diagram illustrating an example of an equivalent circuit of a transistor.

FIG. 4 illustrates an equivalent circuit based on a Berkeley short-channel IGFET model (BSIM) 4 model used in design of a CMOS transistor.

As parasitic resistance and parasitic capacitance, produced in a transistor Tr1, there are gate resistance Rg, gate-drain capacitance Cgd, gate-source resistance Rgs, and gate-source capacitance Cgs. Furthermore, there are drain capacitance (source-drain parasitic capacitance) Cds, drain resistance (source-drain parasitic resistance) Rds, and back gate-source resistance Rbs.

In order to increase the high-frequency gain of the transistor Tr1 (corresponding to an increase in a maximum operating frequency), the gate resistance Rg, the drain capacitance Cds, and the drain resistance Rds only have to be reduced.

Hereinafter, in order to explain an advantageous effect based on the semiconductor device 1 of the present embodiment, a semiconductor device having the multi-finger structure will be described as a comparative example.

Comparative Example

Figure 5:
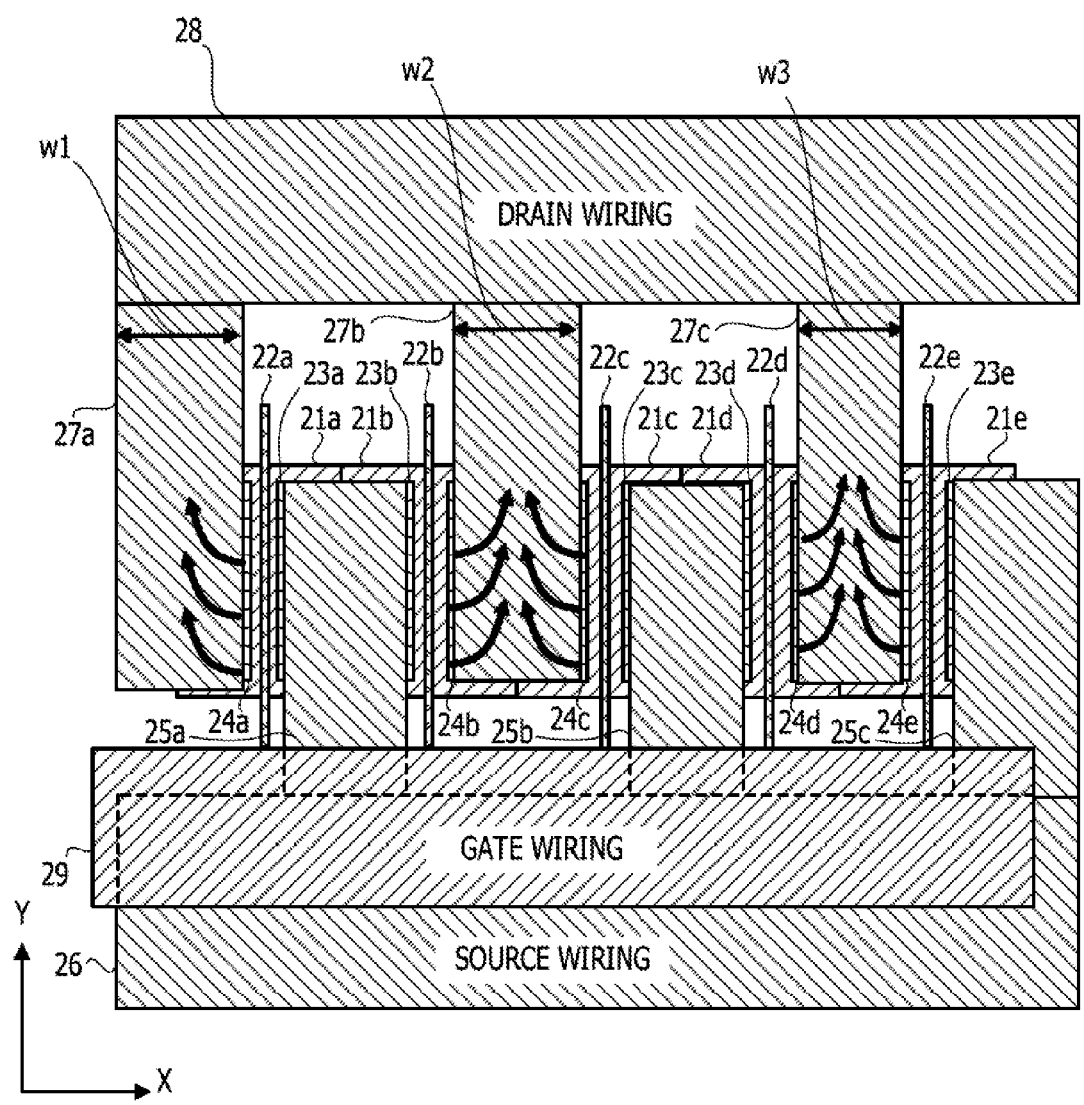
FIG. 5 is a plan view illustrating an example of a semiconductor device having a multi-finger structure.
Figure 6:
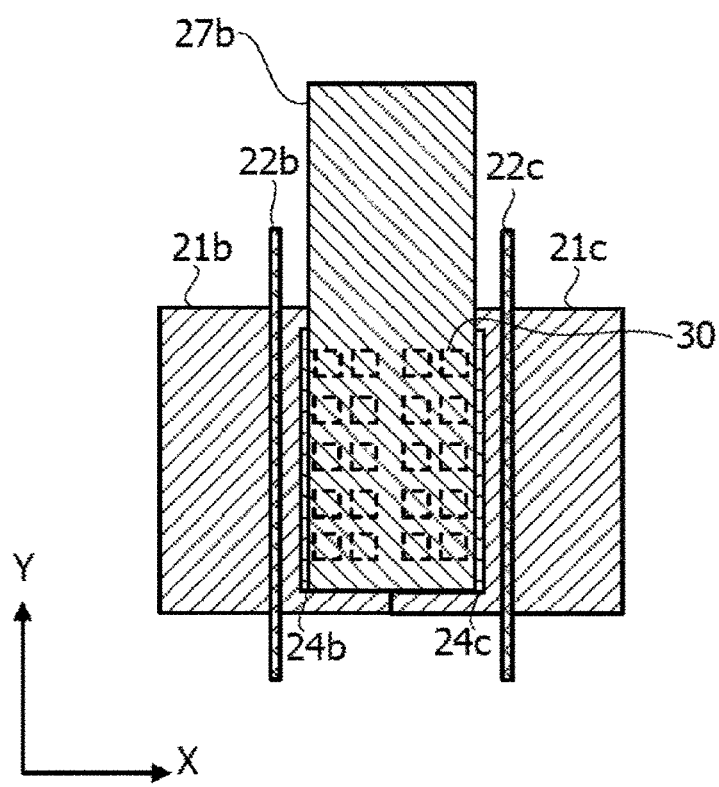
FIG. 6 is a plan view illustrating states of contacts between drain electrodes and a drain wiring.

FIG. 5 is a plan view illustrating an example of a semiconductor device having the multi-finger structure. In addition, FIG. 6 is a plan view illustrating states of contacts between drain electrodes and a drain wiring.

A semiconductor device 20 includes diffusion layers 21a, 21b, 21c, 21d, and 21e formed in an X direction and gate electrodes 22a, 22b, 22c, 22d, and 22e formed over the diffusion layers 21a to 21e, respectively, in a Y direction.

In addition, the semiconductor device 20 includes source electrodes 23a, 23b, 23c, 23d, and 23e and drain electrodes 24a, 24b, 24c, 24d, and 24e, formed in the diffusion layers 21a to 21e.

The source electrodes 23a and 23b are electrically connected to a source wiring 25a, the source electrodes 23c and 23d are electrically connected to a source wiring 25b, and the source electrode 23e is electrically connected to a source wiring 25c. In addition, the source wirings 25a to 25c are electrically connected to a source wiring 26.

The drain electrode 24a is electrically connected to a drain wiring 27a, the drain electrodes 24b and 24c are electrically connected to a drain wiring 27b, and the drain electrodes 24d and 24e are electrically connected to a drain wiring 27c. In addition, the drain wirings 27a to 27c are electrically connected to a drain wiring 28.

As illustrated in, for example, FIG. 6, the drain wiring 27b is connected to the drain electrodes 24b and 24c by vias 30 forming four lines.

In the semiconductor device 20 having such a multi-finger structure as illustrated in FIG. 5, the gate electrodes 22a to 22e are connected to a gate wiring 29 serving as an upper layer wiring, in respective end portions thereof on the lower side of the plane of paper. In this case, gate resistances corresponding to the lengths of the respective gate electrodes 22a to 22e in the Y direction are produced.

In addition, electrons that flow from the drain electrodes 24a to 24e into the drain wirings 27a to 27c via vias not illustrated move to a drain wiring 28 side of an upper layer, as illustrated by arrows in FIG. 5. From this, in each of connection portions between the drain wiring 28 and the drain wirings 27a to 27c, a current density is increased. Therefore, in view of long-term reliability, it is desirable that the widths w1, w2, and w3 of the respective drain wirings 27a to 27c are set sufficiently large.

However, if the widths w1 to w3 are increased, contacts between the drain wirings 27a to 27c and the drain electrodes 24a to 24e cause the widths of the respective diffusion layers 21a to 21e in the X direction to be increased, and cause drain capacitances are increased.

In contrast, in such a semiconductor device 1 as illustrated in FIG. 1 to FIG. 3, the gate extraction wirings 7a to 7e formed so as to sandwich therebetween the individual diffusion layers 3a to 3d in the Y direction are electrically connected to the gate electrode 4 formed so as to straddle the diffusion layers 3a to 3d. From this, in the gate electrode 4, each of gate resistances corresponding to lengths of respective portions sandwiched between the gate extraction wirings 7a to 7e is reduced to a value equivalent to one-half of a value of the corresponding one of the gate resistances.

In addition, in such a semiconductor device 1 as illustrated in FIG. 1 to FIG. 3, directions of respective electric currents that flow in channels formed immediately beneath the gate electrode 4 and directions of respective electric currents that are caused to flow in the drain wiring 9 by electrons extracted from the drain electrodes 6a to 6d correspond to a same direction (the X direction). In other words, a gate width direction (the Y direction) of the gate electrode 4 and the directions of the respective electric currents that flow with respect to the drain wiring 9 connected to the drain electrodes 6a to 6d via vias are orthogonal to each other.

By adopting such a configuration, the current densities in the drain wirings 27a to 27c do not have to be considered in such a manner as in the semiconductor device 20 illustrated in FIG. 5, and the number of contacts between the drain electrodes 6a to 6d and the drain wiring 9 may be reduced.

Figure 7:
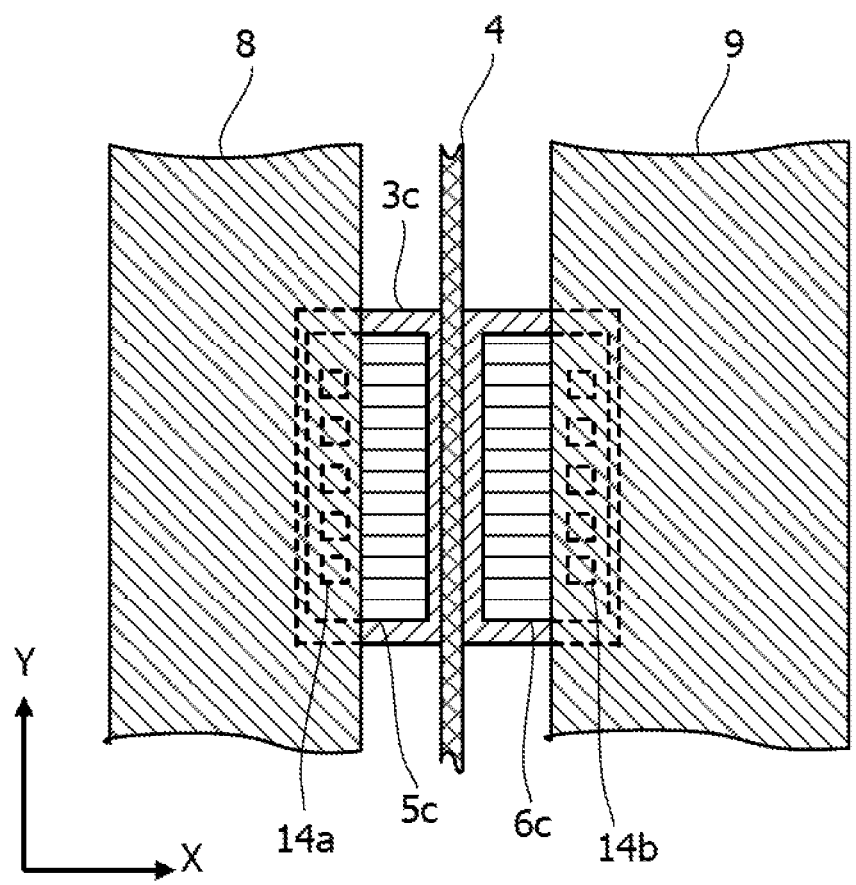
FIG. 7 is a plan view illustrating states of contacts between a source electrode and a source wiring and contacts between a drain electrode and a drain wiring in the semiconductor device of the present embodiment.

FIG. 7 is a plan view illustrating states of contacts between a source electrode and a source wiring and contacts between a drain electrode and a drain wiring in the semiconductor device of the present embodiment.

FIG. 7 illustrates states of examples of contacts between the source electrode 5c and the source wiring 8 and contacts between the drain electrode 6c and the drain wiring 9. The source electrode 5c is connected to the source wiring 8 by vias 14a forming one line in the Y direction. The drain electrode 6c is connected to the drain wiring 9 by vias 14b forming one line in the Y direction.

Contacts between the source electrodes 5a, 5b, and 5d and the source wiring 8 and contacts between the drain electrodes 6a, 6b, and 6d and the drain wiring 9 are the same as described above.

From this, it is possible to decrease lengths of the diffusion layers 3a to 3d in the X direction. Therefore, it is possible to reduce drain capacitances based on junction capacitances between the diffusion layers 3a to 3d and the P-well 11b. Therefore, generation of a loss, caused by leaks of a high-frequency signal from the drain electrodes 6a to 6d to a semiconductor substrate 11 side, is suppressed.

As described above, according to the semiconductor device 1 of the present embodiment, it is possible to reduce gate resistance and drain capacitance. Therefore, it is possible to increase a gain of a transistor in a high-frequency band. In other words, it is possible to increase a maximum operating frequency of the transistor.

As a method for increasing the gain of the transistor in the high-frequency band, it is conceivable that a semiconductor material itself through which electrons pass is switched to a high mobility material (a group III-V semiconductor such as, for example, GaAs). However, in the semiconductor device 1 of the present embodiment, only by adopting such a layout as illustrated in FIG. 1, it is possible to increase a gain in the high-frequency band. Therefore, it is possible to suppress a manufacturing cost.

Figure 8:
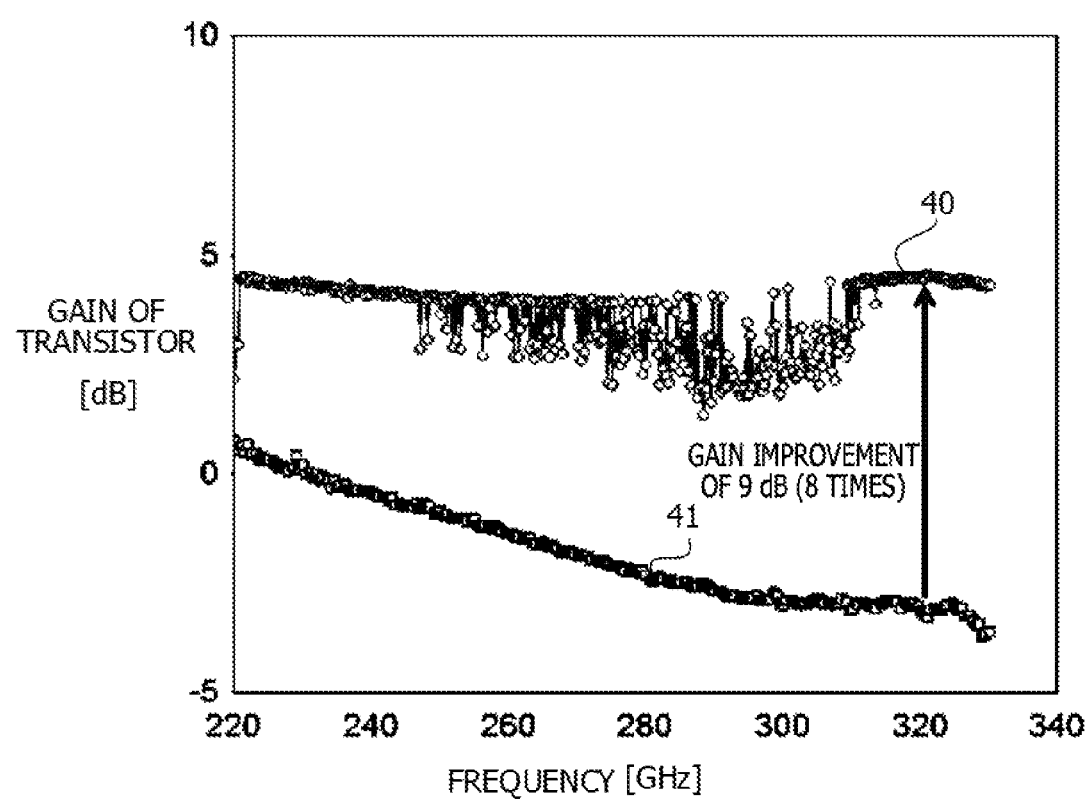
FIG. 8 is a diagram illustrating an example of a relationship between a gain of a transistor and a frequency of an input signal in a case of applying the semiconductor device of the present embodiment.

FIG. 8 is a diagram illustrating an example of a relationship between a gain of a transistor and a frequency of an input signal in a case of applying the semiconductor device of the present embodiment. A horizontal axis indicates the frequency (in units of GHz) of the input signal (a gate signal), and a vertical axis indicates the gain (in units of dB) of the transistor.

A waveform 40 indicates a measurement result of a relationship between the frequency and the gain of a transistor in a case of using the semiconductor device 1 of the present embodiment, illustrated in FIG. 1. On the other hand, a waveform 41 indicates a measurement result of a relationship between the frequency and the gain of a transistor in a case of using the semiconductor device 20 having such a multi-finger structure as illustrated in FIG. 6.

In the semiconductor device 20, like the waveform 41, the gain of the transistor decreases with an increase in frequency. In contrast, in a case of using the semiconductor device 1 of the present embodiment, even if the frequency increases, a decrease in the gain of the transistor is kept at a low level, like the waveform 40. In the vicinity of, for example, 320 GHz, there is a gain improvement of about 9 dB (8 times), compared with the semiconductor device 20.

Second Embodiment

Figure 9:
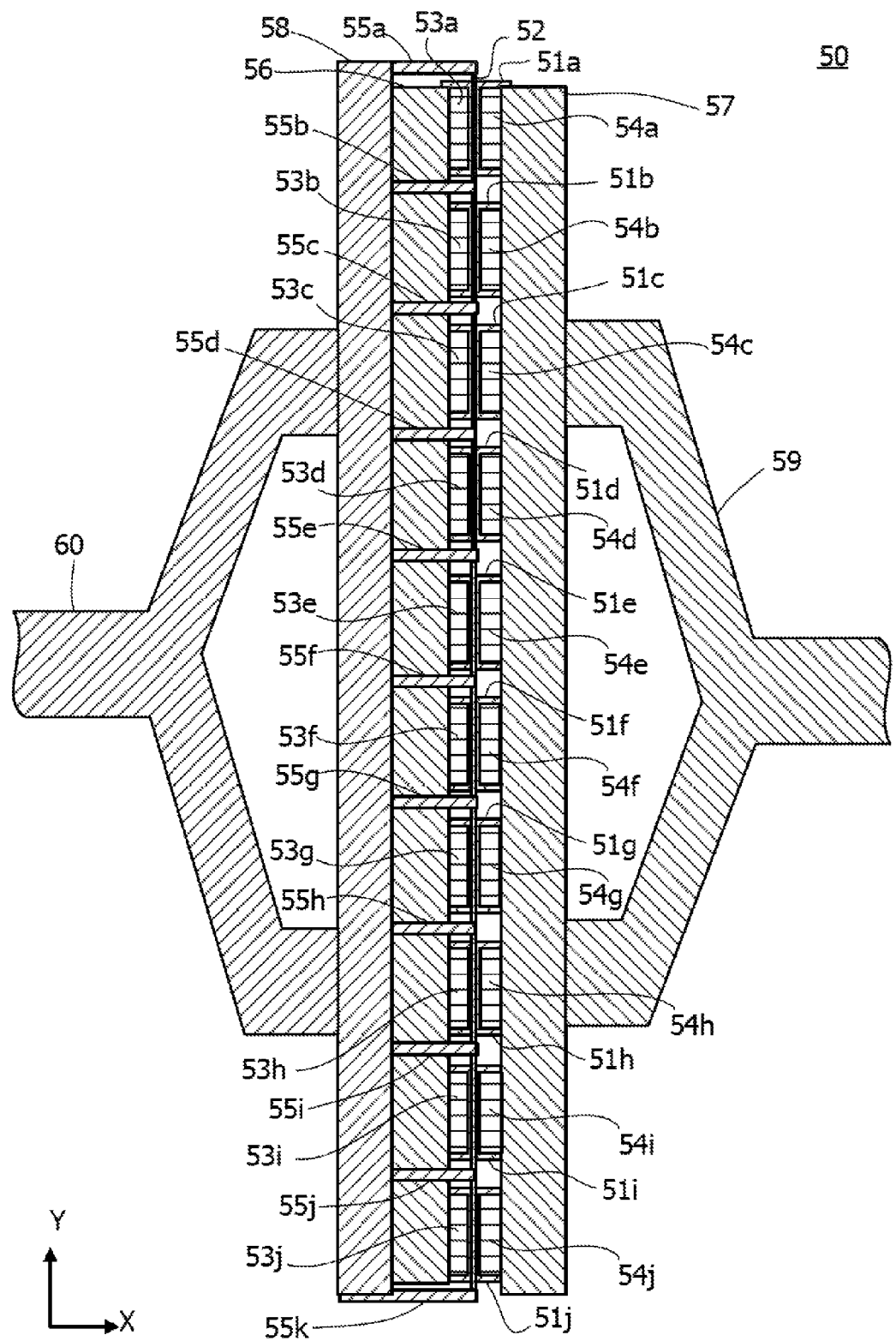
FIG. 9 is a plan view illustrating an example of a semiconductor device of a second embodiment.

FIG. 9 is a plan view illustrating an example of a semiconductor device of a second embodiment.

A semiconductor device 50 includes diffusion layers 51a to 51j, a gate electrode 52, source electrodes 53a to 53j, drain electrodes 54a to 54j, and gate extraction wirings 55a to 55k, which have the same arrangements and connections as those in the semiconductor device 1 of the first embodiment.

In addition, the semiconductor device 50 includes a source wiring 56 to which the source electrodes 53a to 53j are electrically connected, a drain wiring 57 to which the drain electrodes 54a to 54j are electrically connected, and a gate wiring 58 to which the gate extraction wirings 55a to 55k are electrically connected. In the example of FIG. 9, if it is assumed that one transistor is formed so as to correspond to each of the diffusion layers 51a to 51j, 10 transistors are arranged in a Y direction.

Furthermore, the semiconductor device 50 includes a wiring 59 that divides a drain signal propagating in an X direction and that supplies the drain signal to points of the drain wiring 57, the points being located at different positions in the Y direction. In the example of FIG. 9, the horizontal V-shaped wiring 59 is electrically connected to the drain wiring 57 at two points located at different positions in the Y direction.

In addition, the semiconductor device 50 includes a wiring 60 that divides a gate signal propagating in the X direction and that supplies the gate signal to points of the gate wiring 58, the points being located at different positions in the Y direction. In the example of FIG. 9, the horizontal V-shaped wiring 60 is electrically connected to the gate wiring 58 at two points located at different positions in the Y direction.

The wirings 59 and 60 are formed as, for example, wirings in an uppermost layer, which are included in multilayer wirings.

Note that a wiring that divides the drain signal or gate signal propagating in the X direction into three or more and that supplies the drain signal or gate signal to three or more points of the drain wiring 57 or gate wiring 58, the three or more points being located at different positions in the Y direction.

In such a semiconductor device 1 as illustrated in FIG. 1, a length in the Y direction increases with an increase in the number of transistors. In a case of distributing, to the individual transistors, the drain signal or gate signal propagating in the X direction, there is a possibility that a variation in signal path occurs and a variation in the phase of the drain signal or gate signal occurs between the transistors.

Therefore, by disposing such wirings 59 and 60 as illustrated in FIG. 9, it is possible to suppress length variations of the signal paths of the drain signal and the gate signal supplied to each of a large number of transistors arranged in the Y direction. From this, it is possible to suppress phase variations of the drain signal and the gate signal supplied to each of the transistors.

Note that while, in the above-mentioned example, the source wiring 56 is assumed to be grounded and a horizontal V-shaped wiring is not connected to the source wiring 56. However, in a case of forming, for example, p-channel type MOSFETs or the like, such a horizontal V-shaped wiring as described above may be connected to the source wiring 56.

By the way, such semiconductor devices 1 and 50 as illustrated as FIG. 1 and FIG. 9, respectively, are applicable to, for example, the following phased array device.

Example of Application

Figure 10:
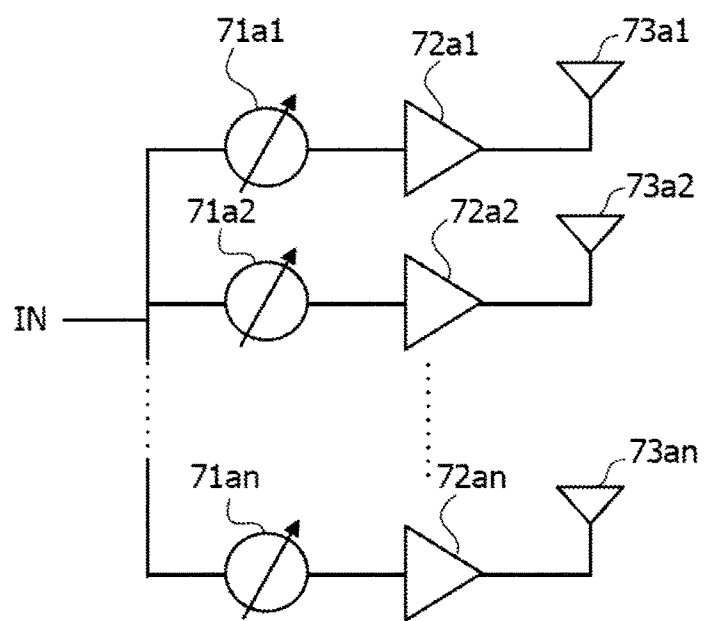
FIG. 10 is a diagram illustrating an example of a phased array device.

FIG. 10 is a diagram illustrating an example of a phased array device.

A phased array device 70 includes phase shifters 71a1, 71a2, . . . , and 71an, which each adjust a phase of an input signal IN, amplifiers 72a1, 72a2, . . . , and 72an, which amplify output signals of the phase shifters 71a1 to 71an, respectively, and antennas 73a1, 73a2, . . . , and 73an.

In such a phased array device 70, radio waves having phases different from one another are output by the respective antennas 73a1 to 73an, thereby transmitting a radio wave in one direction. It is forecast that such a phased array device 70 will be applied to an automotive radar and an equipment for a fifth generation mobile communication system in the future.

Such semiconductor devices 1 and 50 as illustrated as FIG. 1 and FIG. 9, respectively, are used for, for example, such amplifiers 72a1 to 72an in the phased array device 70 as described above. According to the semiconductor devices 1 and 50, it is possible to increase a gain of a transistor in a high-frequency band. Therefore, applicability to the automotive radar that operates in a high frequency range and an equipment for the fifth generation mobile communication system may be expected.

Furthermore, applicability to an imaging device or the like that utilizes a higher frequency range (the THz band) may be expected.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising: a plurality of diffusion layers that are formed over a semiconductor substrate and arranged in a first direction, the plurality of diffusion layers are separated from one another by a separation region;
   a gate electrode of transistors, which is formed in the first direction so as to straddle center portions of the plurality of diffusion layers and center portions of the separation region;
   drain regions and source regions of the transistors formed on both side of the gate electrode in the plurality of diffusion layers;
   drain wirings formed over the drain regions, each of the drain wirings is coupled to each of the drain regions by a first via;
   source wirings formed over the source regions, each of the source wirings is coupled to each of the source regions by a second via;
   gate wiring formed over the source wirings; and
   gate extraction wiring that is prolonged towards the gate electrode from the gate wiring, the gate extraction wiring is coupled to the gate electrode by a third via,
   wherein an electric current flows through a second direction orthogonal to the first direction towards the source wirings from the drain wirings.

2. The semiconductor device according to claim 1, further comprising:
   a gate wiring electrically coupled to each of the gate extraction wirings;
   drain electrodes formed above the respective diffusion layers;
   a drain wiring electrically coupled to the drain electrodes; and
   a wiring that divides a signal propagating in a second direction orthogonal to the first direction and that supplies the signal to points of the gate wiring or the drain wiring, the points being located at different positions in the first direction.

* * * * *